(12) United States Patent
Chen et al.

(10) Patent No.: US 11,469,153 B2
(45) Date of Patent: Oct. 11, 2022

(54) ELECTRONIC COMPONENT COMPRISING SUBSTRATE WITH THERMAL INDICATOR

(71) Applicant: Yangtze Memory Technologies Co., Ltd., Wuhan (CN)

(72) Inventors: Peng Chen, Wuhan (CN); Houde Zhou, Wuhan (CN); Chao Gu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 42 days.

(21) Appl. No.: 16/672,501

(22) Filed: Nov. 3, 2019

(65) Prior Publication Data

US 2021/0082838 A1 Mar. 18, 2021

Related U.S. Application Data

(63) Continuation of application No. PCT/CN2019/105769, filed on Sep. 12, 2019.

(51) Int. Cl.
| | |
|---|---|
| *H01L 23/34* | (2006.01) |
| *H01L 23/00* | (2006.01) |
| *H01L 25/065* | (2006.01) |
| *H01L 23/498* | (2006.01) |

(52) U.S. Cl.
CPC .............. *H01L 23/34* (2013.01); *H01L 24/32* (2013.01); *H01L 24/73* (2013.01); *H01L 25/0657* (2013.01); *H01L 23/49811* (2013.01); *H01L 23/564* (2013.01); *H01L 2224/32225* (2013.01); *H01L 2224/73265* (2013.01); *H01L 2225/0651* (2013.01); *H01L 2225/06562* (2013.01)

(58) Field of Classification Search
CPC ............................... H01L 23/34; H01L 23/564
See application file for complete search history.

(56) References Cited

U.S. PATENT DOCUMENTS

| | | | |
|---|---|---|---|
| 2004/0126897 A1 | 7/2004 | Prince | |
| 2005/0221066 A1 | 10/2005 | Brist | |
| 2005/0285274 A1 | 12/2005 | Burnette | |
| 2007/0087564 A1* | 4/2007 | Speakman | H01M 10/0436 438/674 |
| 2012/0269229 A1* | 10/2012 | Ishida | H01L 21/67248 374/183 |
| 2016/0207762 A1* | 7/2016 | Lu | B81C 1/00309 |

FOREIGN PATENT DOCUMENTS

| | | | | |
|---|---|---|---|---|
| CN | 101330000 A | | 12/2008 | |
| CN | 103311403 A | | 9/2013 | |
| CN | 105874309 A | * | 8/2016 | ............... B32B 7/12 |
| CN | 107871720 A | | 4/2018 | |
| JP | 60210858 A | * | 10/1985 | ....... H01L 23/49827 |

(Continued)

*Primary Examiner* — Michele Fan
(74) *Attorney, Agent, or Firm* — Winston Hsu

(57) ABSTRACT

An electronic component includes a substrate comprising a die attach region and a perimeter region on a front side of the substrate; and at least one thermal indicator disposed within the perimeter region for monitoring the cumulative heat exposure of the substrate. The thermal indicator signals when the predetermined thermal budget limit that correlates with the decline in the condition of the OSP layer or the degradation of the adhesion of the die attach films is reached.

14 Claims, 6 Drawing Sheets

(56) References Cited

FOREIGN PATENT DOCUMENTS

| | | | |
|---|---|---|---|
| JP | 04170085 A | | 6/1992 |
| JP | 2000-223830 A | | 8/2000 |
| JP | 2000223830 A | | 8/2000 |
| JP | 2000223830 A | * | 8/2000 |
| JP | 2005-327855 A | | 11/2005 |
| JP | 2012519863 A | | 8/2012 |
| TW | 200502550 | | 1/2005 |
| TW | I649821 B | | 2/2019 |
| TW | I656427 B | | 4/2019 |
| WO | WO-2010102721 A1 | * | 9/2010 ............... G01K 3/04 |
| WO | 2018/211775 A1 | | 11/2018 |

* cited by examiner

ELECTRONIC COMPONENT COMPRISING SUBSTRATE WITH THERMAL INDICATOR

CROSS REFERENCE TO RELATED APPLICATIONS

The present patent application is a continuation of PCT application Ser. No. PCT/CN2019/105769, filed Sep. 12, 2019, designating the United States, which is hereby incorporated by reference.

BACKGROUND OF THE INVENTION

1. Field of the Invention

The present disclosure relates generally to the field of semiconductor technology. More particularly, the present disclosure relates to an electronic component comprising a substrate having a thermal indicator disposed along a perimeter of the substrate for monitoring the cumulative heat exposure of the substrate.

2. Description of the Prior Art

As known in the art, a package substrate is an important component in the production of semiconductor packages. The package substrate acts as a carrier of the chip or die mounted thereon, and provides connection of electrical signals between chips and a system board. Furthermore, the package substrate also provides heat dissipation to the chip during operation.

Typically, a package substrate may comprise a reinforced polymer laminate material, such as bismaleimide triazine (BT), or a polyimide resin. The package substrate may include a planar die attach surface. During a die attach step of the fabrication process, integrated circuit (IC) dies are adhesively bonded to the die attach surface using an adhesive layer. On the front side of the package substrate, gold-plated fingers are provided. These gold-plated fingers are used to provide electrical signal connection between the die and the substrate. On the rear side of the package substrate, copper-plated solder ball pads are provided to form good connection with the solder balls. To ensure a reliable signal connection, the fingers on the front side and the ball pads on the rear side need to be in good condition during the packaging process.

In order to ensure that the copper on the ball pad is not oxidized during the packaging process, a layer of organic solderability preservative (OSP) is typically applied on the surface of the ball pad, which provides isolation for the surface copper layer of the ball pad. During the die attach (DA) process, the package substrate needs to be heated, and the die attach film (DAF) used to bond the IC die needs to be cured in multi-stage heating process to ensure reliable bonding of the die to substrate and good adhesion between dies. FIG. 6 shows an exemplary stacked die package 6 comprising multiple dies 601 stacked on one another on a substrate 600 and boned together with DAF films 610. However, the DAF films 610 has a limited thermal budget, such as 150° C.—6 hours or 175° C.—3 hours. Exceeding the limit or threshold will result in poor bonding and cause reliability defects.

The package substrate is heated in the DA step, the wire-bonding step, and the molding step, and heating may cause the OSP layer to volatilize. In an abnormal situation (such as machine failure, material anomalies, operational negligence, etc.), the substrate will be over-heated over time, resulting in color change of the substrate, complete volatilization of the OSP, oxidative discoloration of the bond finger, and DAF over cure, which may lead to a series of reliability and quality problems. Currently, the thermal budget control relies on the production-line statistical process control (SPC) system in different stations by different indicators. Because of the many human factors involved, and there are no intuitive indicators, it is easy to misjudge.

SUMMARY OF THE INVENTION

It is one object of the present disclosure to provide an improved electronic component including a substrate having a thermal indicator disposed along a perimeter of the substrate for monitoring the cumulative heat exposure of the substrate, such that the production-line operator may judge directly whether the substrate experiences excess thermal budge that may induce die attach film (DAF) quality issue or OSP evaporation.

According to one aspect of the present disclosure, an electronic component includes a substrate comprising a die attach region and a perimeter region on a front side of the substrate; and at least one thermal indicator disposed within the perimeter region for monitoring the cumulative heat exposure of the substrate.

According to some embodiments, the substrate comprises a package substrate, a wiring board, or a printed circuit board.

According to some embodiments, the substrate comprise a reinforced polymer laminate or a polyimide resin.

According to some embodiments, the die attach region further comprises an array of sub-regions.

According to some embodiments, an integrated circuit (IC) die is adhesively bonded in each of the sub-regions using a die attach film.

According to some embodiments, gold-plated fingers are provided along edges of the IC die in each of the sub-regions.

According to some embodiments, copper-plated solder ball pads are provided on a rear side of the substrate.

According to some embodiments, an organic solderability preservative (OSP) layer is disposed on a surface of each of the copper-plated solder ball pads.

According to some embodiments, the thermal indicator signals when a predetermined thermal budget limit that correlates with decline in the condition of the OSP layer or degradation of the die attach film is reached.

According to some embodiments, the substrate further comprises a plurality of pin holes for positioning purpose, which is disposed in the perimeter region.

According to some embodiments, the thermal indicator is disposed in a trench that is recessed into the front side of the substrate within the perimeter region.

According to some embodiments, the thermal indicator comprises a base material and a heat-sensing agent.

According to some embodiments, the base material is fixed to interior surface of the trench and is not removed during thermal cycles over time.

According to some embodiments, the base material has a porous structure.

According to some embodiments, the heat-sensing agent is supported by the base material in the trench and is coupled to the base material with a bonding mechanism.

According to some embodiments, the heat-sensing agent comprises diacetylenic compound and solvent.

According to some embodiments, the heat-sensing agent further comprises dye fragments, pigments, or colorants.

According to some embodiments, the heat-sensing agent comprises azole compounds, such as imidazoles, benzimidazoles and their derivatives.

According to some embodiments, the heat-sensing agent further comprises a binder.

According to some embodiments, the heat-sensing agent has an evaporation temperature that is approximately equal to that of the OSP layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
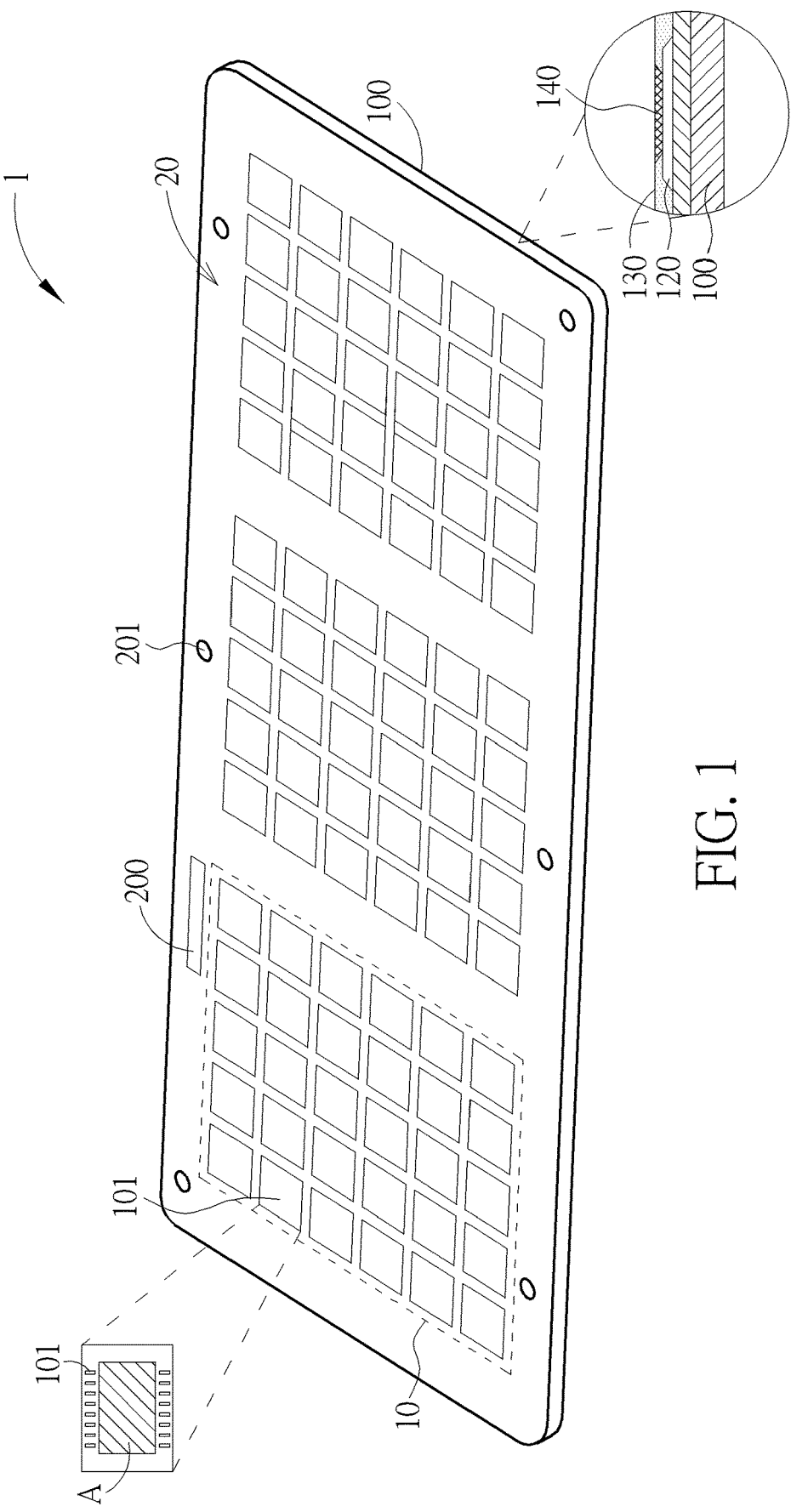
FIG. 1 is a schematic diagram showing an exemplary substrate having a thermal indicator disposed along a perimeter thereof in accordance with one embodiment of the present disclosure.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

A number of issues affect the performance of a high density microelectronic package. Many of these are related to die attach technology. As previously mentioned, the package substrate is heated in the die attach (DA) step, the wire-bonding step, and the molding step, and heating may cause the organic solderability preservative (OSP) layer on the rear side of the substrate to volatilize. In an abnormal situation (such as machine failure, material anomalies, operational negligence, etc.), the substrate will be overheated over time, resulting in color change of the substrate, complete volatilization of the OSP, oxidative discoloration of the bond finger, and DAF over cure, which may lead to a series of reliability and quality problems.

The present disclosure addresses this issue. The present disclosure provides a substrate such as a package substrate or a wiring board with a thermal indicator thereon so that the production line personnel or operator can intuitively determine whether the substrate is overheated.

FIG. 1 is a schematic diagram showing an exemplary substrate having a thermal indicator disposed along a perimeter thereof in accordance with one embodiment of the present disclosure. As shown in FIG. 1, the substrate 1 may be a package substrate, a wiring board, or a printed circuit board. According to one embodiment, for example, the substrate 1 may be a package substrate in a panel scale and may comprise a reinforced polymer laminate 100, such as bismaleimide triazine (BT), or a polyimide resin. The substrate 1 may include a planar die attach region 10 on its front side, which is indicated by dashed line.

The die attach region 10 may further comprise an array of sub-regions 101. For illustration purposes, a schematic, enlarged top view of each of the sub-regions 101 is shown in the left-hand side circle region in FIG. 1. During a die attach step of the fabrication process, an integrated circuit (IC) die A is adhesively bonded onto the die attach region 10 in each sub-region 101 using an adhesive layer or die attach film (not shown). Gold-plated fingers (or "fingers") 110 are provided along the edges of the IC die A in each sub-region 101. These fingers 110 are used to provide electrical signal connection between the IC die A and the substrate 1.

On the rear side of the substrate 1, copper-plated solder ball pads are provided to form good connection with the solder balls. For illustration purposes, a flipped, enlarged sectional view of the ball pad 120 is shown in the right-hand side circle region in FIG. 1. The ball pad 120 may be a copper pad and the peripheral region of the ball pad 120 may be covered by a solder mask 130. In order to ensure that the copper on the ball pad 120 is not oxidized during the packaging process, an OSP layer 140 is typically applied on the exposed surface of the ball pad 120, which provides isolation for the surface copper layer of the ball pad 120. To ensure a reliable signal connection, the fingers 110 on the front side of the substrate 1 and the ball pads 120 on the rear side of the substrate 1 need to be in good condition during the packaging process.

According to one embodiment, the OSP layer 140 is considered to be a low cost SMT-compatible, non-metallic surface finish due to the excellent surface co-planarity of the coated pads. According to one embodiment, the OSP layer 140 is predominantly based on azole compounds, such as imidazoles, benzimidazoles and their derivatives. In general, OSP coating thickness may be from 80-500 nm. Thinner coatings tend to lower the protectiveness against oxidization of copper surfaces, while thicker coatings tend to result in the deterioration of solderability.

According to one embodiment, for example, the substrate 1 further comprises a plurality of pin holes 201 for positioning purpose, which is disposed in the perimeter region 20 of the substrate 1. According to one embodiment, at least one thermal indicator 200 is disposed within the perimeter region 20 of the substrate 1. The thermal indicator 200 may be stripe shaped, but is not limited thereto. It is to be understood that the thermal indicator 200 may be disposed either on the front side or rear side of the substrate 1. In some embodiments, the thermal indicator 200 is disposed on the rear side of the substrate 1 and a camera may be used to monitor the signal of the thermal indicator 200.

Figure 2:
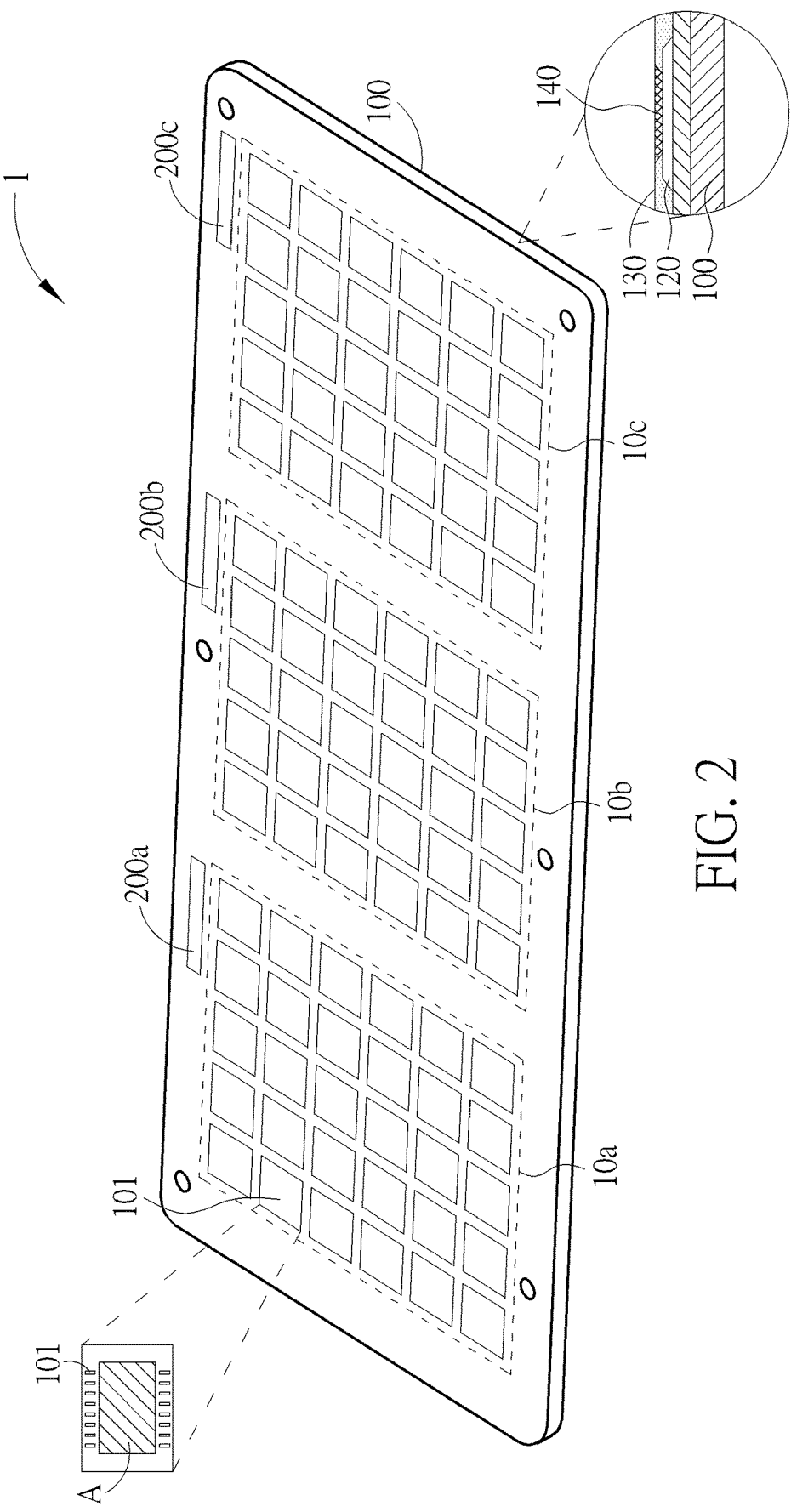
FIG. 2 is a schematic diagram showing an exemplary substrate having multiple thermal indicators disposed along a perimeter thereof in accordance with another embodiment of the present disclosure.

In some embodiments, there may be multiple thermal indicators 200a, 200b, and 200c disposed within the perimeter region 20 of the substrate 1, corresponding to the multiple die attach region 10a, 10b, and 10c, as shown in FIG. 2. FIG. 2 is a schematic diagram showing an exemplary substrate having multiple thermal indicators disposed along a perimeter thereof in accordance with another embodiment of the present disclosure. It is to be understood that the number, shape, and dimension of the thermal indicators 200, 200a, 200b, and 200c are for illustration purposes only. According to one embodiment, the thermal indicators 200, 200a, 200b, and 200c may be used to monitor the cumulative heat exposure of the substrate 1 and may provide signals such as color change, for example, a darkening of an indicator area, which may be generated by a heat-sensing agent such as diacetylenic compound or the like.

The thermal indicators 200, 200a, 200b, and 200c signal when the predetermined thermal budget limit that correlates with the decline in the condition of the SOP layer 140 or the degradation of the adhesion of the die attach films is reached. For example, the color change of the thermal indicators 200, 200a, 200b, and 200c can be visually inspected, and the operation of the production line can be suspended for dispositions from technical group and quality group.

Figure 3:
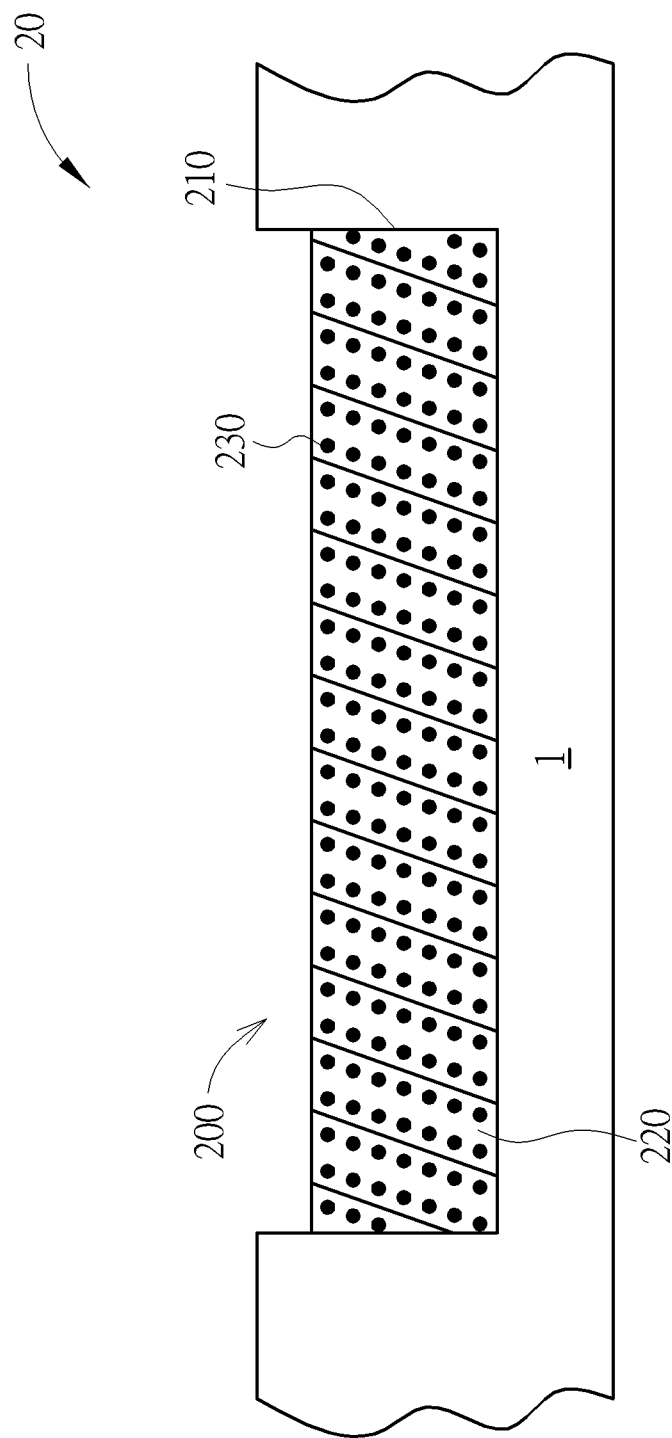
FIG. 3 to FIG. 5 are schematic, cross-sectional diagrams showing the exemplary structure of the thermal indicator in FIG. 1 in accordance with some embodiments of the present disclosure.
Figure 4:
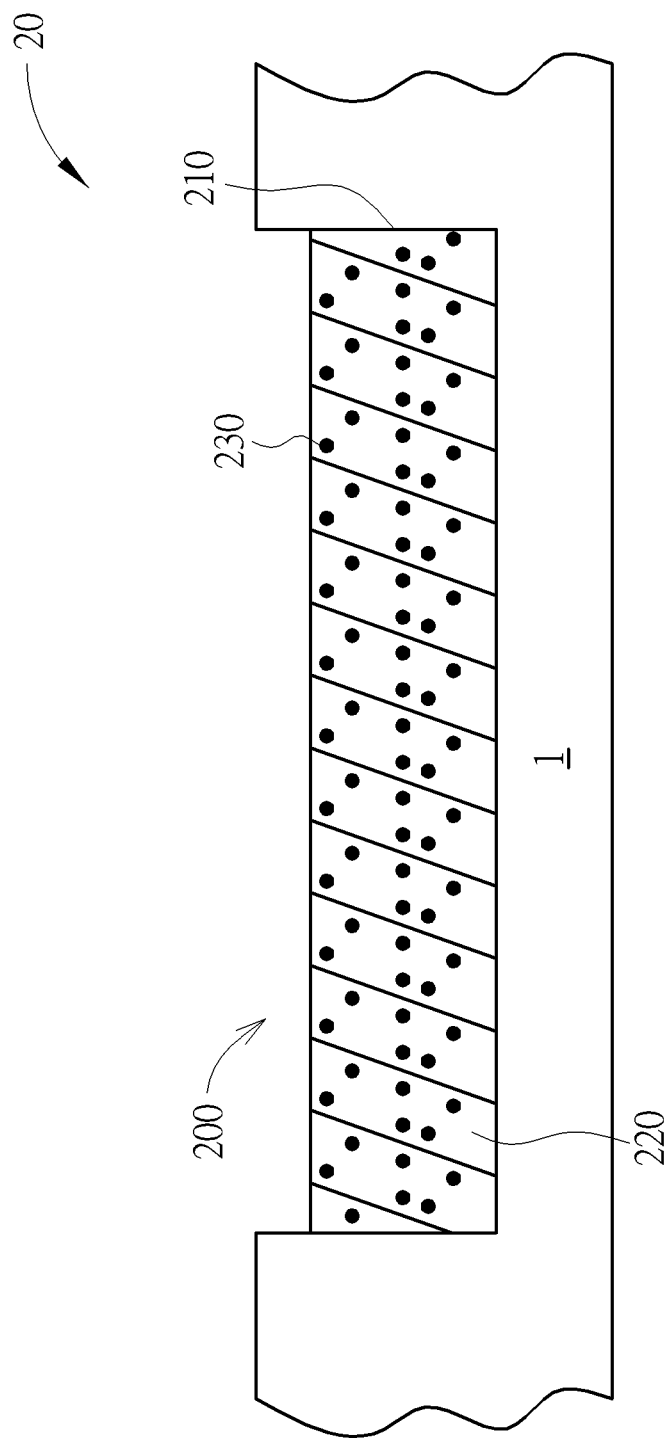
Figure 5:
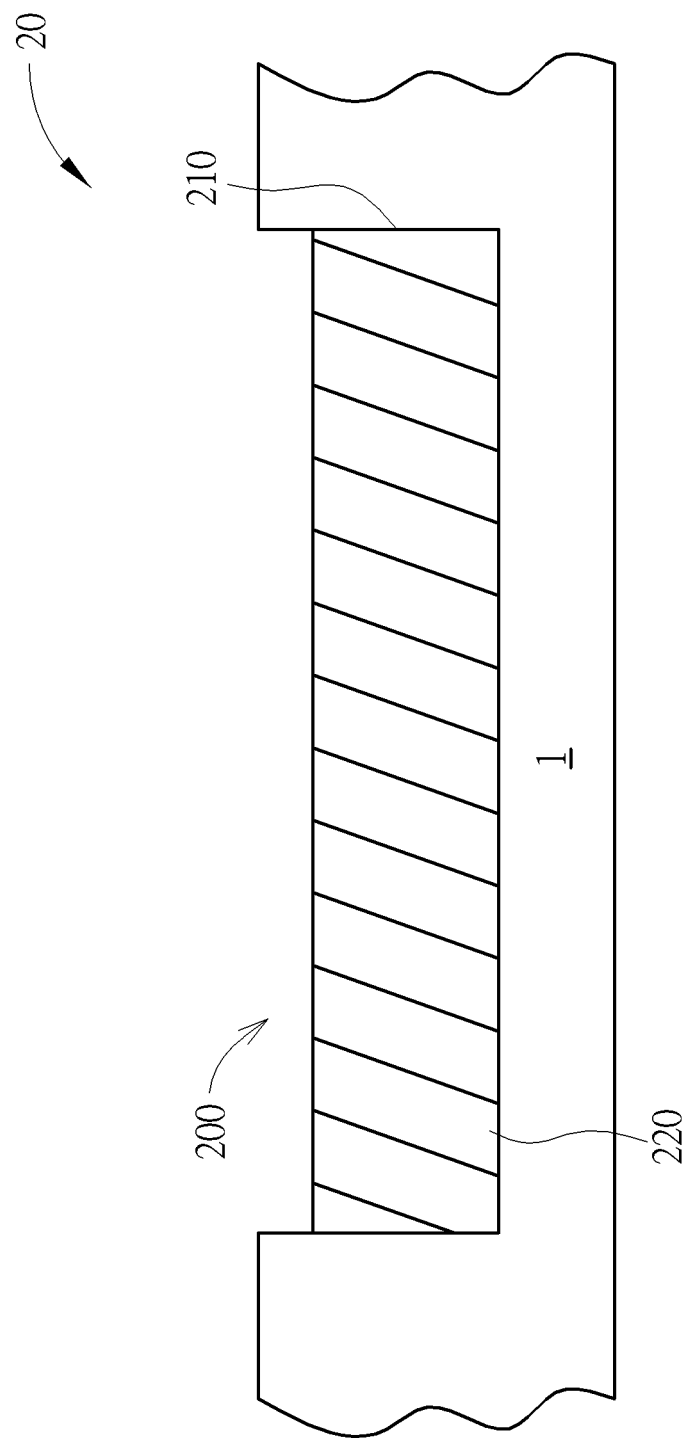
Figure 6:
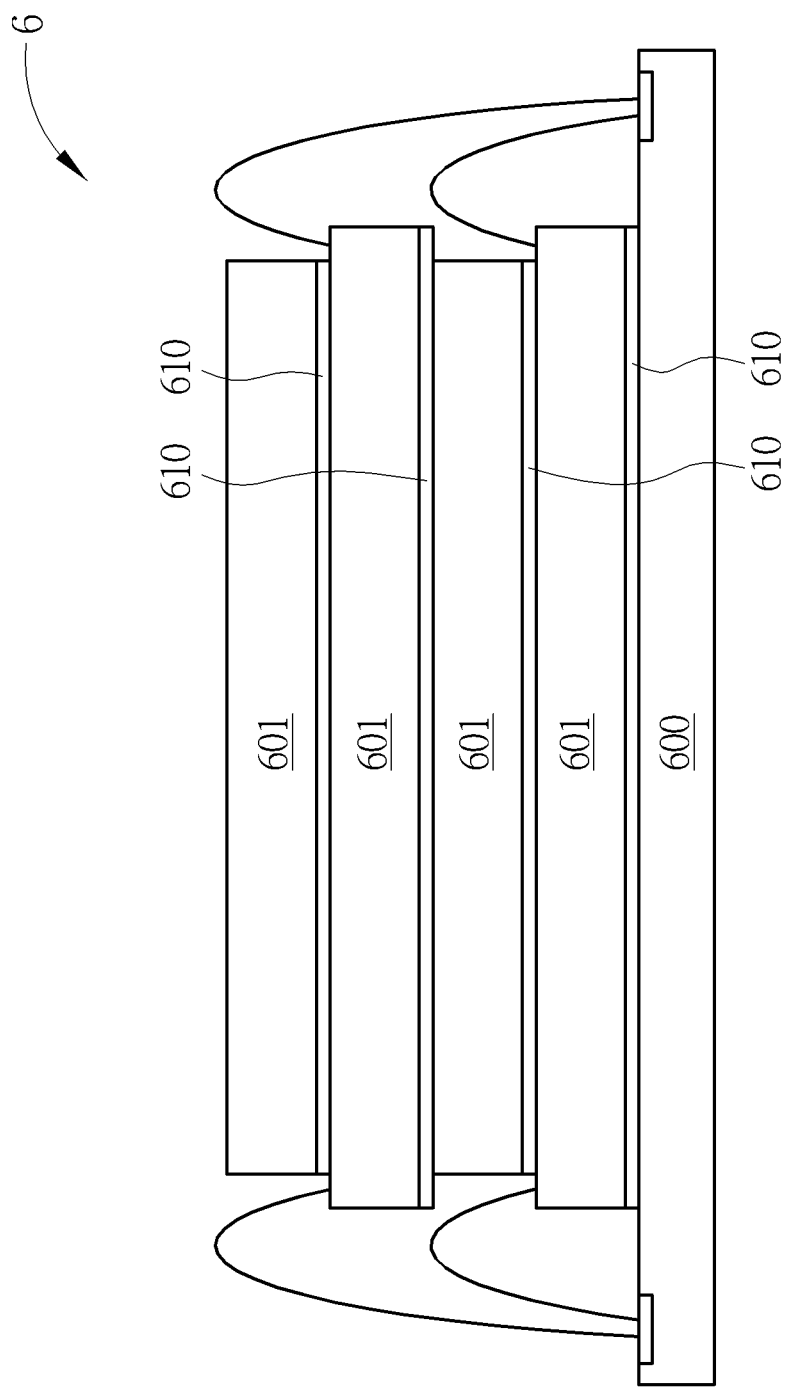
FIG. 6 shows an exemplary stacked die package with multiple dies bonded together with DAF films.

FIG. 3 to FIG. 5 are schematic, cross-sectional diagrams showing the exemplary structure of the thermal indicator 200 in FIG. 1 in accordance with some embodiments of the present disclosure. As shown in FIG. 3, the thermal indicator 200 may be formed in a trench (or a pit) 210 that is recessed into a front surface of the substrate 1 within the perimeter region 20. For example, the depth of the trench 210 may range between several micrometers to several millimeters, depending upon the amount of chemical materials used. According to one embodiment of the present disclosure, the thermal indicator 200 may comprise two major parts: a base (or matrix) material 220, and a heat-sensing agent 230. According to one embodiment of the present disclosure, for example, the base material 220 may be soaked with the heat-sensing agent 230. In some embodiments, the thermal indicator 200 may further comprise additives and/or solvents.

For example, in some embodiments, the base material 220 may be fixed to the interior surface of the trench 210 and is not removed during the thermal cycles over time. For example, the base material 220 may have a porous structure, but is not limited thereto. The heat-sensing agent 230 may be supported by the base material 220 in the trench 210 and may be coupled to the base material 220 with suitable bonding mechanism such as hydrogen bonding or Van der Waals force, but not limited thereto. According to one embodiment, for example, the heat-sensing agent 230 may comprise diacetylenic compound and solvent. According to one embodiment, for example, the heat-sensing agent 230 may further comprise dye fragments, pigments, or colorants. According to some embodiments, for example, the heat-sensing agent 230 may comprise azole compounds, such as imidazoles, benzimidazoles and their derivatives. According to some embodiments, for example, the heat-sensing agent 230 may further comprise a binder.

As shown in FIG. 4, it shows that the thermal indicator gradually changes its color (or opaque appearance) after experiencing cumulative heat exposure during the packaging process as some of the heat-sensing agent 230 evaporates. According to one embodiment of the present disclosure, preferably, the heat-sensing agent 230 has an evaporation temperature that is approximately equal to that of the OSP layer 140.

As shown in FIG. 5, when the predetermined thermal budget limit (e.g., 150° C.—6 hours or 175° C.—3 hours) that correlates with the decline in the condition of the SOP layer 140 or the degradation of the adhesion of the die attach films is reached, the heat-sensing agent 230 completely evaporates and escapes from the trench 210, thereby leaving only the base material 220 in the trench 210. The evaporated heat-sensing agent 230 and solvent may be evacuated through the exhaust piping system in order to prevent contamination to the substrate and the die.

After the heat-sensing agent 230 completely evaporates, the thermal indicator 200 presents the original color such as while color of the base material 220 and a signal with high contrast can be observed. It is understood that other materials that present color change when experiencing thermal cycles during packaging process may be employed. For example, the diacetylenic compounds may polymerize to provide a color change or another optically readable indication. The color change of the thermal indicator 200 can be visually inspected, and the operation of the production line can be suspended for dispositions from technical group and quality group.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic component, comprising:
a substrate comprising a die attach region and a perimeter region on a front side of the substrate, wherein the die attach region further comprises an array of sub-regions;
a trench recessed into the front side of the substrate within the perimeter region; and
at least one thermal indicator disposed within the trench for monitoring the cumulative heat exposure of the substrate, wherein the thermal indicator comprises a base material having a porous structure and a heat-sensing agent, and wherein the base material is soaked with the heat-sensing agent and the base material is fixed to interior surface of the trench.

2. The electronic component according to claim 1, wherein the substrate comprises a package substrate, a wiring board, or a printed circuit board.

3. The electronic component according to claim 1, wherein the substrate comprise a reinforced polymer laminate or a polyimide resin.

4. The electronic component according to claim 1, wherein the substrate further comprises a plurality of pin holes for positioning purpose, which is disposed in the perimeter region.

5. The electronic component according to claim 1, further comprising:
an integrated circuit (IC) die adhesively bonded in each of the sub-regions using a die attach film.

6. The electronic component according to claim 5, wherein gold-plated fingers are provided along edges of the IC die in each of the sub-regions.

7. The electronic component according to claim 1 further comprising:
copper-plated solder ball pads provided on a rear side of the substrate.

8. The electronic component according to claim 7, wherein the heat-sensing agent comprises azole compounds, such as imidazoles, benzimidazoles and their derivatives.

9. The electronic component according to claim 1 further comprising:
an organic solderability preservative (OSP) layer disposed on a surface of each of the copper-plated solder ball pads, wherein the at least one thermal indicator signals when a thermal budget limit that correlates with decline in the condition of the SOP layer or degradation of adhesion of the die attach film is reached.

10. The electronic component according to claim 1, wherein the heat-sensing agent has an evaporation temperature that is approximately equal to that of the OSP layer.

11. The electronic component according to claim 1, wherein the heat-sensing agent is supported by the base material in the trench and is coupled to the base material with a bonding mechanism.

12. The electronic component according to claim 1, wherein the heat-sensing agent comprises diacetylenic compound and solvent.

13. The electronic component according to claim 12, wherein the heat-sensing agent further comprises dye fragments, pigments, or colorants.

14. The electronic component according to claim 1, wherein the heat-sensing agent further comprises a binder.

* * * * *